United States Patent

Chen et al.

[11] Patent Number: 6,127,212
[45] Date of Patent: Oct. 3, 2000

[54] METHOD OF FORMING A CMOS TRANSISTOR

[75] Inventors: Chin-Lan Chen, Tao-Yuan Hsien; Cheng-Tung Huang, Kao-Hsiung; Shih-Chieh Hsu, Taipei; Yi-Chung Sheng, Hsin Chu, all of Taiwan

[73] Assignee: United Microelectronics Corp., Hsin-Chu, Taiwan

[21] Appl. No.: 09/488,811

[22] Filed: Jan. 21, 2000

[51] Int. Cl.[7] ............................................. H01L 21/8238
[52] U.S. Cl. ...................... 438/199; 438/232; 438/305; 257/204
[58] Field of Search .................... 438/199, 230, 438/232, 231, 303, 305; 257/202, 204

[56] References Cited

U.S. PATENT DOCUMENTS

| | | | |
|---|---|---|---|
| 5,248,350 | 9/1993 | Lee | 148/33.2 |
| 5,877,050 | 3/1999 | Gardner et al. | 438/231 |
| 5,885,887 | 3/1999 | Hause et al. | 438/564 |
| 5,953,614 | 9/1999 | Liu et al. | 438/303 |
| 5,956,591 | 9/1999 | Fulford, Jr. | 438/305 |
| 5,994,743 | 11/1999 | Masuoka | 257/369 |

*Primary Examiner*—Matthew Smith
*Assistant Examiner*—Robert Hullinger
*Attorney, Agent, or Firm*—Winston Hsu

[57] ABSTRACT

The present invention provides a method for forming a CMOS transistor on a semiconductor wafer. The semiconductor wafer comprises a substrate, a first gate positioned on the substrate being used to form a PMOS transistor of the CMOS transistor, and a second gate positioned on the substrate being used to form an NMOS transistor of the CMOS transistor. First spacers are formed on both lateral surfaces of the first gate and of the second gate. A first ion implantation process is performed to form a pair of first doped regions in the substrate, oppositely adjacent to the first gate, the pair of first doped regions to serve as heavy doped drain (HDD) of the PMOS transistor. Then the thickness of the first spacers is reduced. A second ion implantation process is performed to form a pair of second doped regions in the substrate, oppositely adjacent to the second gate, the pair of second doped regions to serve as the HDD of the NMOS transistor. Second spacers are then formed covering each first spacer. Finally, sources/drains for the PMOS transistor and the NMOS transistor are formed in the substrate, oppositely adjacent to the first gate and the second gate.

19 Claims, 4 Drawing Sheets

METHOD OF FORMING A CMOS TRANSISTOR

BACKGROUND OF THE INVENTION

1. Field of the Invention

The present invention relates to a method for forming a complementary metal-oxide semiconductor (CMOS) transistor, and more particularly, to a method for forming a CMOS transistor which can prevent short channel effects.

2. Description of the Prior Art

With the increasing component density of semiconductor devices, CMOS transistors, which consume less energy, are widely used in ultra-large scale integrated (ULSI) designs. A CMOS transistor is composed of two complementary transistors, which are a PMOS transistor and an NMOS transistor. There are typically three different types of the CMOS transistors: P-well CMOS transistors, N-well CMOS transistors and twin well CMOS transistors. When the line width of a semiconductor device is less than 1 $\mu$m, due to resulting electrical characteristics, twin well CMOS transistors become the elements of choice in circuit designs. Therefore, improving the CMOS manufacturing process to increase the performance of CMOS devices, and twin well CMOS devices in particular, is an important issue in the semiconductor industry.

Please refer to FIG. 1 and FIG. 2. FIG. 1 and FIG. 2 are cross sectional diagrams of a prior art method for forming a CMOS transistor 36 on a semiconductor wafer 10. As shown in FIG. 1, a semiconductor wafer 10 comprises a silicon substrate 12, a p-well 14 positioned on the substrate 12, an n-well 16 positioned on the substrate 12 adjacent to the p-well 14, a gate 20 positioned on the p-well 14 to form an NMOS transistor 33 of the CMOS transistor 36, a gate 21 positioned on the n-well 16 to form a PMOS transistor 34 of the CMOS transistor 36, and a field oxide layer 18 positioned on the p-well 14 and the n-well 16 around the gates 20 and 21, serving as an insulation layer.

In the prior art method for forming the CMOS transistor 36, using the gates 20, 21 as hard masks, two ion implantation processes are performed adjacent to and abutting the gates 20, 21 so as to form an n-type doped region 22 on the p-well 14 and a p-type doped region 24 on the n-well 16. The doped regions 22, 24 serve as heavy doped drains (HDD) of the NMOS transistor 33 and the PMOS transistor 34, respectively. Chemical vapor deposition (CVD) processes are then performed to form a silicon oxide layer and a silicon nitride layer on the semiconductor wafer 10. A dry etching process is performed to remove the silicon oxide layer and the silicon nitride layer down to the surface of the p-well 14 and the n-well 16. The residual silicon oxide layers and silicon nitride layers on each of the two lateral surfaces of each of the gates 20, 21 form liner oxides 26 and spacers 28. Then, using the gates 20, 21 and the spacers 28 as hard masks, two ion implantation processes are performed adjacent to and abutting the spacers 28 so as to form an n-type doped region 30 on the p-well 14 and a p-type doped region 32 on the n-well 16. The doped regions 30, 32 serve as sources/drains of the NMOS transistor 33 and the PMOS transistor 34, as shown in FIG. 2.

Please refer to FIG. 3. FIG. 3 is a cross sectional diagram of a prior art CMOS transistor 36 in which the doped regions 30, 32 and the HDD 22, 24 have become diffused. After the formation of the CMOS transistor 36, thermal processes may be performed on the semiconductor wafer 10, such as the formation of a self-aligned silicide (salicide) layer on the gates 20, 21 and the source/drain. These thermal processes will result in diffusion of the dopants in the HDD 20, 22 and in the doped regions 30, 32. This results in a decrease of the designed channel length of the transistor. In the method for forming the prior art CMOS transistor 36, the doped areas of the HDD 22, 24 are adjacent to the gates 20, 21. The diffusion rates of p-type dopants (such as boron or $BF_2^+$) are faster than those of n-type dopants (such as phosphorous or arsenic), and so the reduced channel length is more obvious in the PMOS transistor 34. Furthermore, short channel effects may occur in the CMOS transistor 36. Additionally, when the doped region 32 of the PMOS transistor 34 has been diffused, the area of the drain under the gate 21 increases, which may result in an overlap capacitance between the gate and the drain. Such capacitances increase the RC time, affecting the electrical performance of the CMOS transistor.

SUMMARY OF THE INVENTION

It is therefore a primary objective of the present invention to provide a method for forming a CMOS transistor to solve the above-mentioned problems.

In a preferred embodiment, the present invention provides a semiconductor wafer comprising a substrate, a first gate positioned on the substrate and being used to form a PMOS transistor of the CMOS transistor, and a second gate positioned on the substrate and being used to form an NMOS transistor of the CMOS transistor. First spacers are formed on both lateral surfaces of the first gates and of the second gates. A first ion implantation process is performed to form a pair of first doped regions in the substrate, oppositely adjacent to the first gate, the first doped regions to serve as heavy doped drains (HDD) of the PMOS transistor. The thickness of the first spacers is then reduced. A second ion implantation process is performed to form a pair of second doped regions in the substrate, oppositely adjacent to the second gate, the second doped region to serve as an HDD of the NMOS transistor. Then, a second spacer is formed covering each first spacer. Finally, sources/drains for the PMOS transistor and the NMOS transistor are formed in the substrate, oppositely adjacent to the first gate and to the second gate, respectively.

It is an advantage of the present invention that additional exterior spacers are formed on both lateral faces of the two gates of the CMOS transistor. By controlling the thickness of the spacers, the doped areas of the HDD and the doped regions can be adjusted and the diffusion rate of the dopants in the NMOS transistor and that in the PMOS transistor can be balanced. As a result, short channel effects in the CMOS transistor can be prevented.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
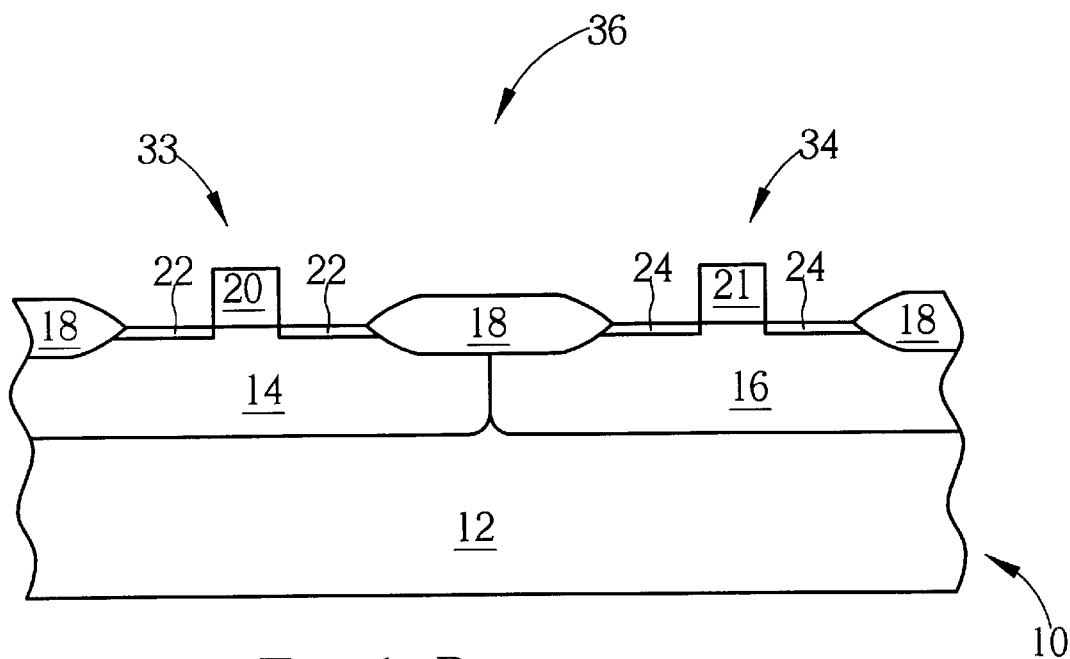
FIG. 1 and FIG. 2 are cross sectional diagrams of a prior art method for forming a CMOS transistor on a semiconductor wafer.
Figure 2:
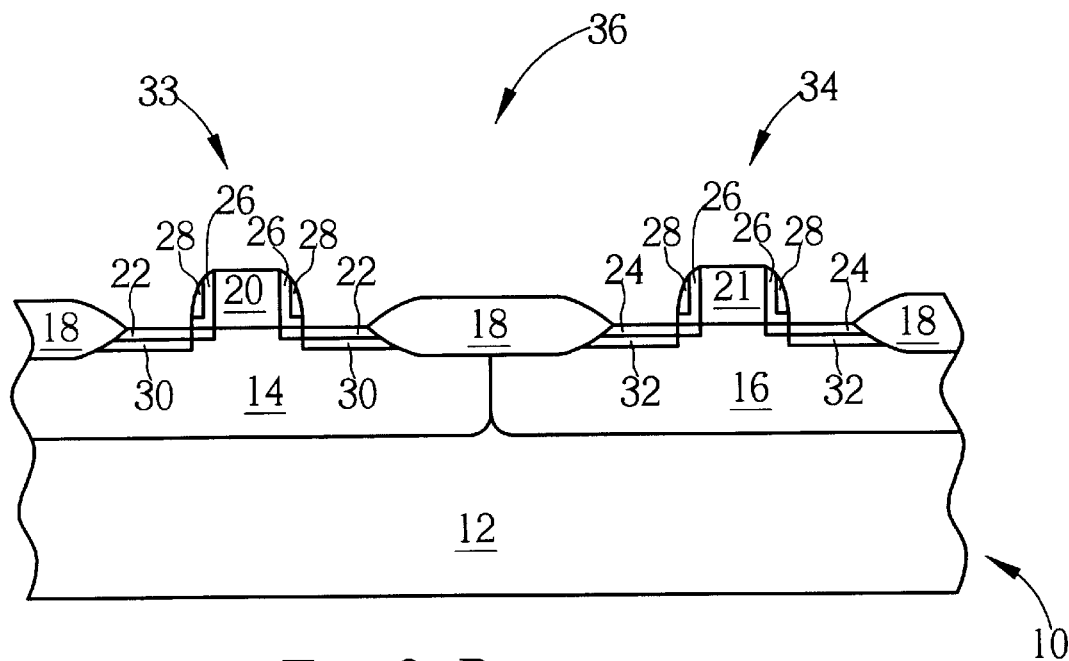
Figure 3:
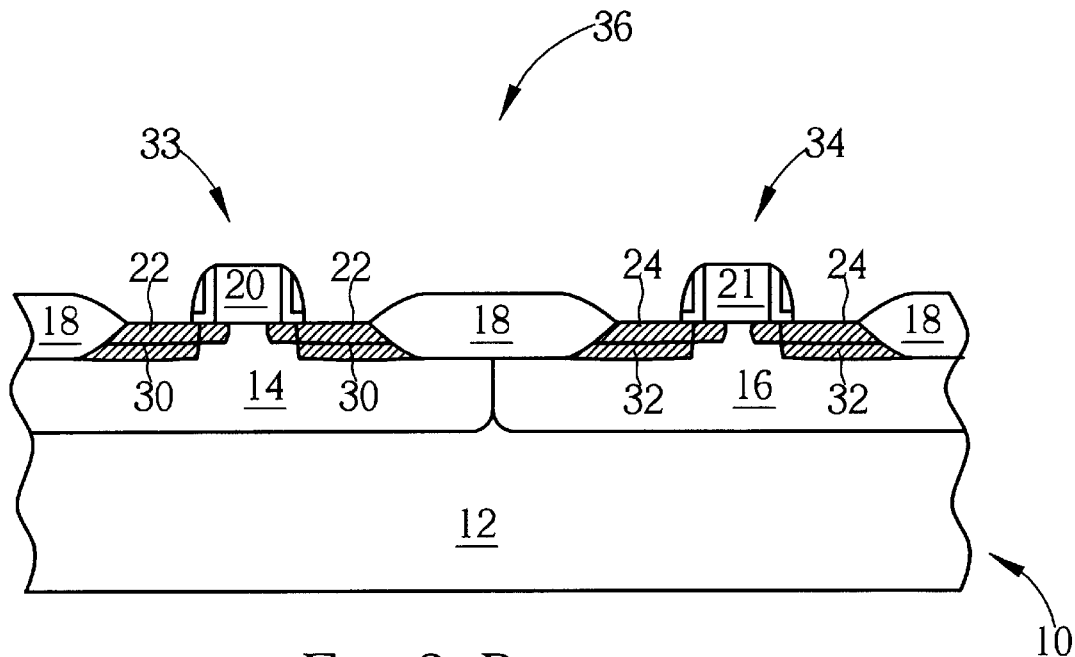
FIG. 3 is a cross sectional diagram of a prior art CMOS transistor in which the doped regions and the HDD have become diffused.
Figure 4:
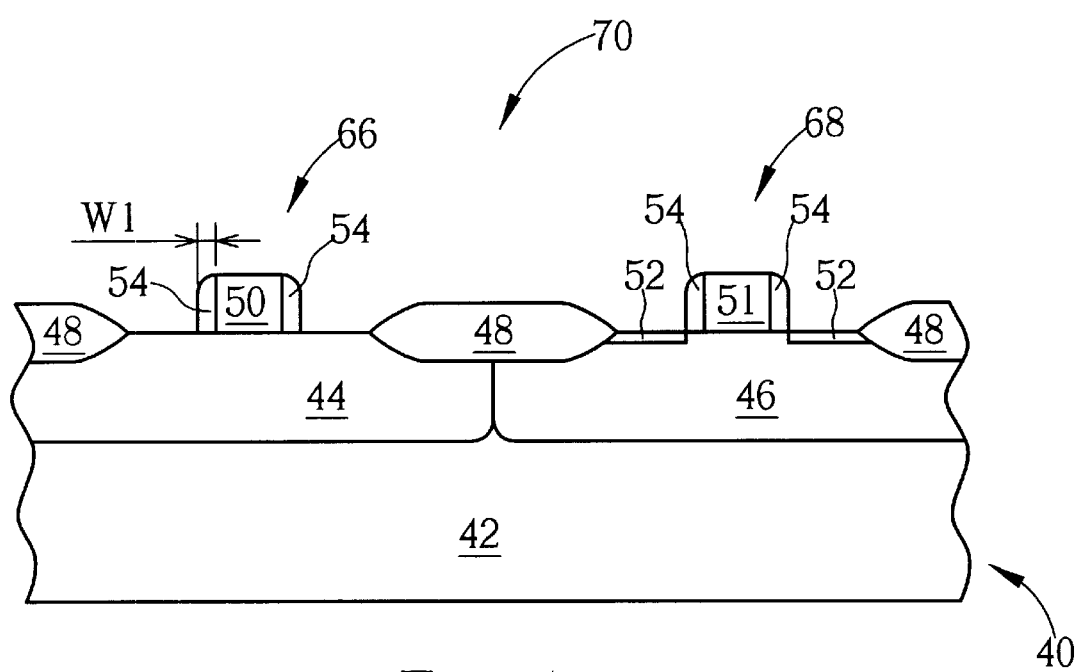
FIG. 4 to FIG. 6 are cross sectional diagrams of a method for forming a CMOS transistor on a semiconductor wafer according to the present invention.
Figure 5:
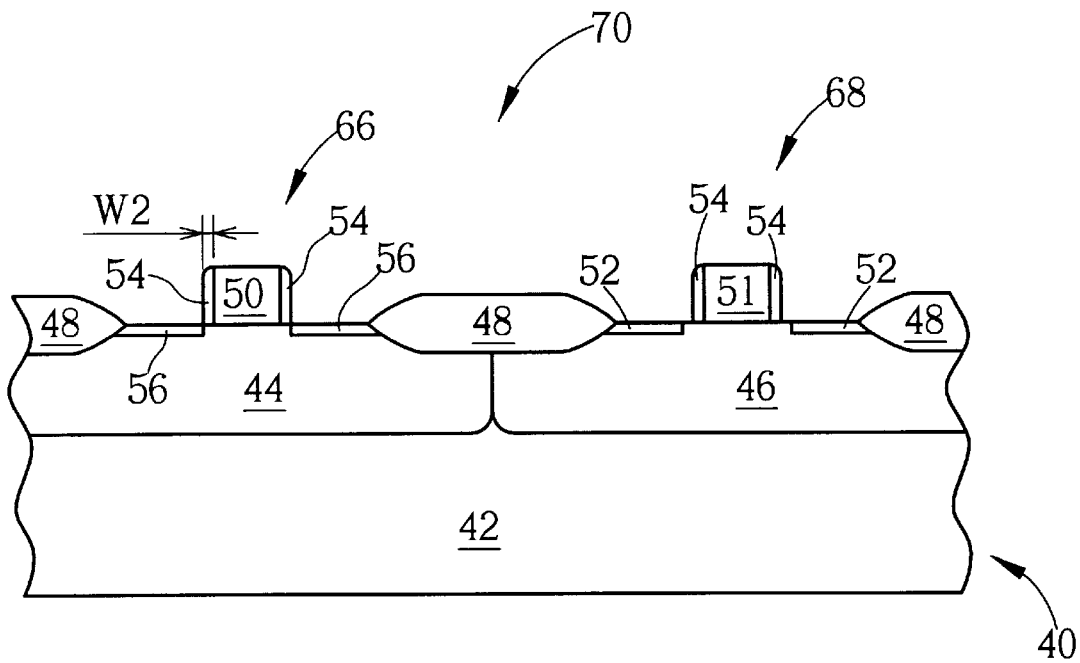
Figure 6:
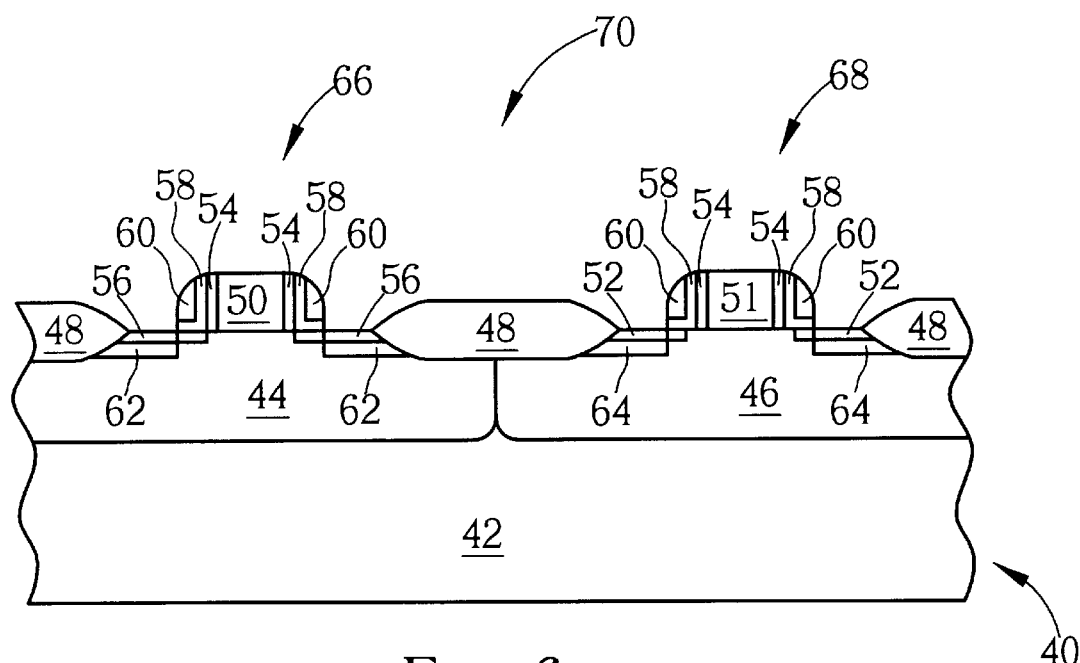

Please refer to FIG. 4 to FIG. 6. FIG. 4 to FIG. 6 are cross sectional diagrams of a method for forming a CMOS transistor 70 on a semiconductor wafer 40 according to the present invention. As shown in FIG. 4, the semiconductor wafer 40 comprises a silicon substrate 42, a p-well 44 positioned on the substrate 42, an n-well 46 positioned on the substrate 42 adjacent to the p-well 44, a gate 50 positioned on the p-well 44 to form an NMOS transistor 66 of the CMOS transistor 70, a gate 51 positioned on the n-well 46 to form a PMOS transistor 68 of the CMOS transistor 70, and a field oxide layer 48 positioned on the p-well 44 and the n-well 46 that surrounds the gates 50, 51 and serves as an insulation layer.

In the method for forming the present invention CMOS transistor 70, a thin film deposition process is performed using a CVD method to deposit a silicon dioxide layer on the surface of the semiconductor wafer 40. Then, an etching-back process is performed to remove the silicon dioxide layer down to the surface of the n-well 46 and the p-well 44, leaving each of the two lateral surfaces of each of the two gates 50, 51 with only a residual layer of silicon dioxide. These residual silicon dioxide layers form spacers 54. The thickness $W_1$ of the spacer 54 is about 200–300 angstroms at the face of the substrate 42, i.e., on the surface of the p-well 44 and the n-well 46. The spacers 54 are used to adjust positions of doped regions in the NMOS transistor 66 and PMOS transistor 68 that are subsequently formed. A photolithographic process is performed to form a photoresist layer on the areas that are outside of the region predetermined to form the PMOS transistor 68. Using the gate 51 and the spacer 54 as hard masks, an ion implantation process is performed to dope p-type dopants into the n-well 46 so as to form a pair of HDD 52 of the PMOS transistor 68, oppositely adjacent to and abutting the spacer 54. The p-type dopants are chosen from group IIIA, such as boron or $BF_2^+$ atoms. The photoresist layer is then stripped.

As shown in FIG. 5, a clean process is performed using RCA standard clean solution or dilute HF (DHF) solution to reduce the thickness of the spacer 54. The thickness $W_2$ of the spacer 54 is reduced to 100–200 angstroms at the face of the substrate, that is, on the surface of the p-well 44 and n-well 46. A photolithographic process is performed to form a photoresist layer on the areas that are outside of the region predetermined to form the NMOS transistor 66. Using the gate 50 and the spacer 54 as hard masks, an ion implantation process is performed to dope n-type dopants into the p-well 44 so as to form a pair of HDD 56 of the NMOS transistor 66, oppositely adjacent to and abutting the spacer 54. The n-type dopants are chosen from group VA, such as phosphorous or arsenic atoms. The photoresist layer is then stripped.

Because the spacers 54 are thinner when forming the HDD 56, the channel length of the NMOS transistor 66 will be less than that of the PMOS transistor 68. This is shown in FIG. 5 as the HDD 52 of the PMOS transistor 68 no longer abuts the spacers 54. In this way the channel lengths of the transistors 66, 68 can be adjusted relative to each other. Also, in this manner, the differing diffusion values of the dopants in the HDD 56 and the HDD 52 can be taken into account.

After the formation of the HDD 56, 52 of the NMOS transistor 66 and the PMOS transistor 68, a dry etching process or a wet etching process is optionally performed to strip the spacers 54. The spacers 54 can, however, be kept to combine with a liner oxide in the subsequent process. In the present invention embodiment, the spacers 54 are kept.

As shown in FIG. 6, CVD processes are performed to deposit a silicon oxide layer and a silicon nitride layer onto the semiconductor wafer 40. A dry etching process is performed to remove the silicon nitride layer and the silicon oxide layer down to the surface of the p-well 44 and the n-well 46, leaving each of the two lateral surfaces of each of the two gates 50, 51 with only residual layers of silicon oxide and silicon nitride. These residual layers form liner oxides 58 and spacers 60. As before, a photoresist layer is formed over the surface of the semiconductor wafer 40, except in the region of the PMOS transistor 68. Using the gate 51 and the spacers 60 as hard masks, an ion implantation process is performed on the n-well 46 to form a pair of p-type doped regions 64 in the substrate 42, oppositely adjacent to and abutting the spacer 60. The doped regions 64 form the source/drain for the PMOS transistor 68. The photoresist layer is then stripped. Another photoresist layer is formed on the areas that are outside of the NMOS transistor 66. Using the gate 50 and the spacers 60 as hard masks, an ion implantation process is performed on the p-well 44 to form an n-type doped region 62, oppositely adjacent to and abutting the spacers 60. The doped regions 62 form the source/drain of the NMOS transistor 66. The photoresist layer is then stripped.

Figure 7:
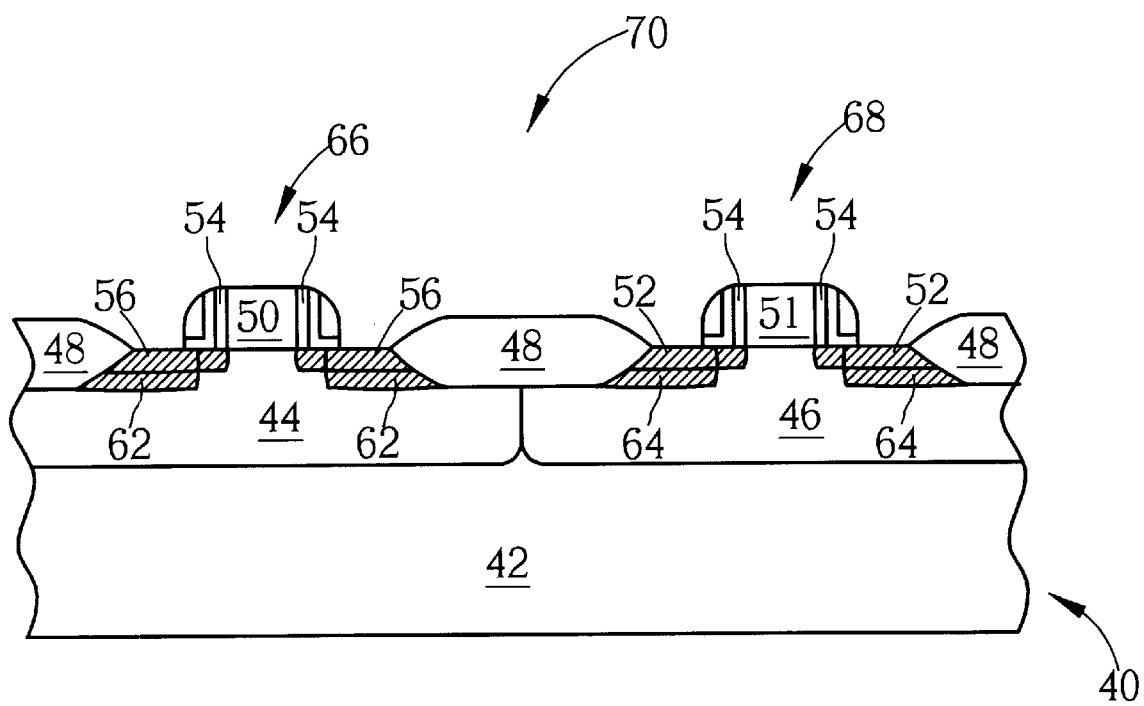
FIG. 7 is a cross sectional diagram of a CMOS transistor of the present invention in which the doped regions and the HDD have become diffused.

Please refer to FIG. 7. FIG. 7 is a cross sectional diagram of a CMOS transistor 70 according to the present invention in which the doped regions 62, 64 and the HDD 52, 56 have become diffused. After the formation of the CMOS transistor 70, some thermal processes may be performed on the semiconductor wafer 40. These thermal processes will result in diffusion of the dopants in the HDD 52, 56 and the doped regions 62, 64. Spacers 54 are formed adjacent to the present invention gates 50, 51 of the CMOS transistor 70 and are used to control the positions of the doped regions. A sufficient distance is maintained in the channel length of the CMOS transistor 70 so as to prevent short channel effects. In the present invention method, an ion implantation process is performed first to form a doped region for the PMOS transistor 68. Then a clean process is performed to reduce the thicknesses of the spacers 54. Then another ion implantation process is performed to form another doped region for the NMOS transistor 66. Since this method uses the different thicknesses of the spacers 54 as hard masks in the two ion implantation processes, the positions of the doped regions can be controlled by the spacers. Also, the different diffusion rates of the NMOS transistor 66 and the PMOS transistor 68 can be balanced, and the channel length can be kept to design specifications so as to prevent short channel effects. Additionally, when the doped regions 64 of the PMOS transistor 68 have become diffused, the area of drain under the gate 51 is less than that of the prior art. Hence, overlap capacitance between the gate and the drain is reduced and the electrical performance of the CMOS transistor is improved.

In the present invention method for forming the CMOS transistor, an alternative method may also be used to adjust the positions of the doped regions of the NMOS transistor and the PMOS transistor. First, an ion implantation process is performed on the p-well to form a pair of doped regions in the substrate oppositely adjacent to and abutting the gate of the NMOS transistor. Then, spacers are formed on both lateral surfaces of the two gates. Another ion implantation process is performed on the n-well to form another pair of doped regions oppositely adjacent to and abutting the spacers of the PMOS transistor. By using the spacers as hard masks in the ion implantation process, this method also adjusts the HDD distances in the PMOS transistor and in the NMOS transistor, so as to balance the different diffusion rates of the dopants in the NMOS transistor and in the PMOS transistor.

In contrast to the prior art method for forming the CMOS transistor, extra, exterior spacers are formed on both lateral faces of the two gates of the CMOS transistor. By controlling the thicknesses of the spacers, the doped areas of the HDD and the doped regions can be adjusted and the diffusion rate of the dopants in the NMOS transistor and in the PMOS transistor can be balanced. As a result, short channel effects in the CMOS transistor can be prevented.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming a complementary metal-oxide semiconductor (CMOS) transistor on a semiconductor wafer, the semiconductor wafer comprising a substrate, a first gate positioned on the substrate and used to form a p-type metal-oxide semiconductor (PMOS) transistor of the CMOS transistor, and a second gate positioned on the substrate and used to form an n-type metal-oxide semiconductor (NMOS) transistor of the CMOS transistor, the method comprising:

forming first spacers on both lateral surfaces of the first gate and of the second gate;

performing a first ion implantation process to form a pair of first doped regions in the substrate, oppositely adjacent to the first gate, the pair of first doped regions to serve as heavy doped drains (HDD) of the PMOS transistor;

reducing the thickness of the first spacers;

performing a second ion implantation process to form a pair of second doped regions in the substrate, oppositely adjacent to the second gate, the pair of second doped regions to serve as heavy doped drains (HDD) of the NMOS transistor;

forming a second spacer covering each first spacer; and forming sources and drains for the PMOS transistor and the NMOS transistor, in the substrate oppositely adjacent to the first gate and second gate, respectively.

2. The method of claim 1 wherein the substrate further comprises an n-well positioned under the first gate, and a p-well positioned under the second gate.

3. The method of claim 1 wherein the first spacers are of silicon dioxide and have a thickness of 200–300 angstroms at the face of the substrate.

4. The method of claim 3 wherein the method of forming the first spacers comprises:

forming a silicon dioxide layer on the surfaces of the substrate and the gates; and performing an etch-back process to remove the silicon dioxide layer, leaving each of the two lateral surfaces of each of the two gates with only a residual layer of silicon dioxide, which residual layers form the first spacers.

5. The method of claim 1 wherein the diffusion rate of the dopants in the first doped regions is greater than that of the dopants in the second doped regions.

6. The method of claim 1 wherein the dopants used in the first ion implantation process are chosen from group IIIA, such as boron or BF2+ atoms, and the dopants used in the second ion implantation process are chosen from group VA, such as phosphorous or arsenic atoms.

7. The method of claim 1 wherein the method of reducing the thickness of the first spacers comprises performing a clean process using RCA standard clean solution or dilute HF (DHF) solution, thereby reducing the thickness of the first spacers to 100–200 angstroms at the face of the substrate.

8. The method of claim 1 wherein the method further comprises a dry etching process or a wet etching process after the second ion implantation process, and the etching process is used to remove the first spacers completely.

9. The method of claim 1 wherein the method further comprises forming liner oxides before forming the second spacers, the method of forming the liner oxides and the second spacers comprising:

forming a silicon oxide layer on the surfaces of the substrate and the gates;

forming a silicon nitride layer on the silicon oxide layer; and performing an etch-back process to remove the silicon nitride layer and the silicon oxide layer, leaving each of the two lateral surfaces of each of the two gates with only residual layers of silicon oxide and silicon nitride, which residual layers form the liner oxides and the second spacers, respectively.

10. The method of claim 1 wherein the method of forming the sources and the drains for the PMOS transistors and the NMOS transistors comprises:

performing a third ion implantation process to form a pair of third doped regions in the substrate, oppositely adjacent to the first gate, the pair of third doped regions to provide the source and the drain for the PMOS transistor; and performing a fourth ion implantation process to form a pair of fourth doped regions in the substrate, oppositely adjacent to the second gate, the pair of fourth doped regions to provide the source and the drain of the NMOS transistor.

11. A method for forming a complementary metal-oxide semiconductor (CMOS) transistor on a semiconductor wafer, the semiconductor wafer comprising a substrate, a first gate positioned on the substrate and used to form a p-type metal-oxide semiconductor (PMOS) transistor of the CMOS transistor, and a second gate positioned on the substrate and used to form an n-type metal-oxide semiconductor (NMOS) transistor of the CMOS transistor, the method comprising:

performing a first ion implantation process to form a pair of first doped regions in the substrate, oppositely adjacent to the first gate, the pair of first doped regions to serve as heavy doped drains (HDD) of the PMOS transistor;

forming first spacers on both lateral surfaces of each gate;

reducing the thickness of the first spacers;

performing a second ion implantation process to form a pair of second doped regions in the substrate, oppositely adjacent to the first gate, the pair of second doped regions to serve as HDD of the PMOS transistor;

forming a second spacer covering each first spacer; and forming sources and drains for the PMOS transistor and the NMOS transistor, in the substrate oppositely adjacent to the first gate and second gate, respectively.

12. The method of claim 11 wherein the substrate further comprises an n-well positioned under the first gate, and a p-well positioned under the second gate.

13. The method of claim 11 wherein the first spacers are of silicon dioxide and have a thickness of 200–300 angstroms at the face of the substrate.

14. The method of claim 13 wherein the method of forming the first spacers comprises:

forming a silicon dioxide layer on the surfaces of the substrate and the gates; and performing an etch-back process to remove the silicon dioxide layer, leaving each of the two lateral surfaces of each of the two gates with only a residual layer of silicon dioxide, which residual layers form the first spacers.

15. The method of claim 11 wherein the diffusion rate of the dopants in the first doped regions is greater than that of the dopants in the second doped regions.

16. The method of claim 11 wherein the dopants used in the first ion implantation process are phosphorus or arsenic atoms which are chosen from group VA, and the dopants used in the second ion implantation process are boron or BF2+ atoms which are chosen from group IIIA.

17. The method of claim 11 wherein the method further comprises a dry etching process or a wet etching process after the second ion implantation process, and the etching process is used to remove the first spacers completely.

18. The method of claim 11 wherein the method further comprises forming liner oxides before forming the second spacers, the method of forming the liner oxides and the second spacers comprising:

forming a silicon oxide layer on the surfaces of the substrate and the gates;

forming a silicon nitride layer on the silicon oxide layer; and performing an etch-back process to remove the silicon nitride layer and the silicon oxide layer, leaving each of the two lateral surfaces of each of the two gates with only residual layers of silicon oxide and silicon nitride, which residual layers form the liner oxides and the second spacers, respectively.

19. The method of claim 11 wherein the method of forming the sources and the drains for the PMOS transistors and the NMOS transistors comprises:

performing a third ion implantation process to form a pair of third doped regions in the substrate, oppositely adjacent to the first gate, the pair of third doped regions to provide the source and the drain for the PMOS transistor; and performing a fourth ion implantation process to form a a pair of fourth doped regions in the substrate, oppositely adjacent to the second gate, the pair of fourth doped regions to provide the source and the drain for the NMOS transistor.

* * * * *